United States Patent [19]

Vaes

[11] Patent Number: 5,445,915
[45] Date of Patent: Aug. 29, 1995

[54] IMAGING ELEMENT AND METHOD FOR MAKING A LITHOGRAPHIC PRINTING PLATE ACCORDING TO THE SILVER SALT DIFFUSION TRANSFER PROCESS

[75] Inventor: Jos Vaes, Betekom, Belgium

[73] Assignee: AGFA-Gevaert, N.V., Mortsel, Belgium

[21] Appl. No.: 371,568

[22] Filed: Jan. 11, 1995

[30] Foreign Application Priority Data

Feb. 17, 1994 [EP] European Pat. Off. ............ 94200404

[51] Int. Cl.$^6$ .......................... G03C 8/06; G03C 8/28; G03C 8/52; G03F 7/07

[52] U.S. Cl. .................................. 430/204; 430/227; 430/229; 430/231; 430/950

[58] Field of Search ................ 430/204, 227, 229, 231, 430/950

[56] References Cited

U.S. PATENT DOCUMENTS

| | | | |
|---|---|---|---|
| 4,743,525 | 5/1988 | Yamamoto et al. | 430/204 |
| 5,281,509 | 1/1994 | Murakata et al. | 430/204 |
| 5,387,483 | 2/1995 | Takagi | 430/204 |

FOREIGN PATENT DOCUMENTS 546598  6/1993  European Pat. Off. ............ 430/231

*Primary Examiner*—Richard L. Schilling
*Attorney, Agent, or Firm*—Breiner & Breiner

[57] ABSTRACT

The present invention provides an imaging element comprising on a support in the order given a base layer containing a matting agent having a number average diameter between 0.4 and 1 times the thickness of said base layer, a spectrally sensitized silver halide emulsion layer and a receiving layer containing physical development nuclei having an average diameter less than 6 nm and wherein the number of nuclei having a diameter larger than 4.5 nm is less than 15% of the total number of nuclei contained in said receiving layer and wherein substantially no matting agent is present in said receiving layer, silver halide emulsion layer or any other layer optionally being present between said receiving layer and silver halide emulsion layer.

5 Claims, No Drawings

IMAGING ELEMENT AND METHOD FOR MAKING A LITHOGRAPHIC PRINTING PLATE ACCORDING TO THE SILVER SALT DIFFUSION TRANSFER PROCESS

FIELD OF THE INVENTION

The present invention relates to lithographic printing plates obtained according the silver salt diffusion transfer process. More in particular the present invention relates to a method for making such printing plates wherein the imaging elements for making such printing plates are exposed by means of a high intensity short time scanning exposure (hereinafter referred to as scan exposure) e.g. a laser exposure.

BACKGROUND OF THE INVENTION

The principles of the silver complex diffusion transfer reversal process, hereinafter called DTR-process, have been described e.g. in U.S. Pat. No. 2,352,014 and in the book "Photographic Silver Halide Diffusion Processes" by André Rott and Edith Weyde—The Focal Press—London and New York, (1972).

In the DTR-process non-developed silver halide of an information-wise exposed photographic silver halide emulsion layer material is transformed with a so-called silver halide solvent into soluble silver complex compounds which are allowed to diffuse into an image-receiving element and are reduced therein with a developing agent, generally in the presence of physical development nuclei, to form a silver image having reversed image density values ("DTR-image") with respect to the black silver image obtained in the exposed areas of the photographic material.

A DTR-image bearing material can be used as a planographic printing plate wherein the DTR-silver image areas form the water-repellant ink-receptive areas on a water-receptive ink-repellant background. The DTR-image can be formed in the image-receiving layer of a sheet or web material which is a separate element with respect to the photographic silver halide emulsion material (a so-called two-sheet DTR element) or in the image-receiving layer of a so-called single-support-element, also called mono-sheet element, which contains at least one photographic silver halide emulsion layer integral with an image-receiving layer in waterpermeable relationship therewith. It is the latter mono-sheet version which is preferred for the preparation of offset printing plates by the DTR method. For example the United Kingdom Patent Specification 1,241,661 discloses a method for the production of a planographic printing plate consisting of a sheet material comprising an outer hydrophilic colloid layer on the surface of which there is concentrated a silver image stemming from an underlying exposed silver halide emulsion layer by the silver complex diffusion transfer reversal process. The silver image formed on the surface is suitable for printing images in a lithographic printing process using a dampening liquid.

Commercial lithographic printing plate precursors of the latter type typically contain on a support in the order given a base layer serving as an anti-halation layer, a silver halide emulsion layer and a surface layer containing physical development nuclei in which the silver image is formed.

Such lithographic printing plate precursors, also called imaging elements may be camera exposed or they can be exposed by means of a scan exposure e.g. a laser or L.E.D. exposure. The latter offers the advantage that the preparation of the printing plate is simplified in that a paste-up to be used for the exposure of the imaging element can be completely prepared on a computer. This paste-up prepared on the computer is then transferred to an image setter equipped with e.g. laser that takes care of the exposure of the imaging element.

Such printing plates obtained by scan exposure are however more susceptible to wearing of the metallic silver which accepts the greasy ink. This is especially a problem for small printing details in a large non-printing area. As a consequence the printing plates are limited in printing endurance. Printing plates obtained by means of camera exposure appear to be less critical in this respect.

It was already proposed in DE 3435792 to use a matting agent having a size larger than the thickness of the base layer, in said base layer while keeping the amount of matting agent in the silver halide emulsion layer and physical development nuclei layer low. However, even if all the matting agent were included in the base layer of such printing plate, the above problem still occurs, probably because the silver halide emulsion layer may still be disturbed at places where a matting agent is present.

However by reducing the size of the matting agent below the thickness of the base layer, it was found that the printing plate tends to accept ink at the non-image areas, so-called staining.

SUMMARY OF INVENTION

It is an object of the present invention to provide an imaging element suitable for scan exposure and that can yield printing plates of improved quality, i.e. high printing endurance and reduced staining.

It is a further object of the present invention to provide a method for making a printing plate according to the silver salt diffusion transfer process by means of scan exposure.

Further objects of the present invention will become clear from the description hereinafter.

According to the present invention there is provided an imaging element comprising on a support in the order given a base layer containing a matting agent having a number average diameter between 0.4 and 1 times the thickness of said base layer, a spectrally sensitized silver halide emulsion layer and a receiving layer containing physical development nuclei having an average diameter less than 6 nm and wherein the number of nuclei having a diameter larger than 4.5 nm is less than 15% of the total number of nuclei contained in said receiving layer and wherein substantially no matting agent is present in said receiving layer, silver halide emulsion layer or any other layer optionally being present between said receiving layer and silver halide emulsion layer.

According to the present invention there is further provided a method for making a lithographic printing plate comprising the steps of image-wise exposing an imaging element as defined above and subsequently developing a thus obtained imaging element by an alkaline processing liquid in the presence of developing agent(s) and silver halide solvent(s).

DETAILED DESCRIPTION OF THE PRESENT INVENTION

By making use of a matting agent having a number average diameter that is between 0.4 and 1 times, preferably between 0.5 and 0.8 times the thickness of the base layer disturbance of the silver halide emulsion layer is substantially avoided. As a consequence the wearing of metallic silver at the surface of the printing plate is much reduced with respect to printing plates having a larger matting agent. With the thickness of the base layer is meant the thickness of the base layer without the matting agent. This thickness may be easily calculated from the amount of the ingredients present in the base layer and taking into account their respective densities.

The base layer in connection with the present invention may consist of several layers, some of which may serve as adhesion improving layers.

The number average diameter of the matting agent should be between 0.4 and 1 times the thickness of the base layer so as to assure that most of the matting agent is substantially included in the base layer without protruding too much into the silver halide emulsion layer where it would disturb the distribution of the silver halide crystals. The number average diameter of the matting agent should not be lower than 0.4 times the thickness of the base layer because in that case the printing plate would become insufficiently hydrophilic at the non-image areas to repel the ink at the non-image areas.

Although the term "diameter" is used to characterize the size of the matting agent, this does not imply that the matting agent has to be spherical in shape. On the contrary, it is preferred that the matting is irregular in shape. When the matting agent is irregular in shape, a hypothetical diameter can be used corresponding to a sphere having an equivalent volume. The average diameter of a matting agent in connection with the present invention can be measured by means of a Coulter Counter. Preferably the matting agent has a number average diameter between 1.5 $\mu$m and 7 $\mu$m. The total coverage of matting agent in the base layer is preferably between 0.1 g/m$^2$ and 1.5 g/m$^2$ more preferably between 0.2 g/m$^2$ and 0.9 g/m$^2$.

Suitable matting agents for use in connection with the present invention are organic and inorganic matting agents e.g. silica, alumina, calcium carbonate, starch, polymethylmethacrylates, polyethylacrylates or mixtures thereof. Most preferably an inorganic matting agent is used that has a porous structure such as for example silica.

The base layer usually contains gelatin as hydrophilic colloid binder. Mixtures of different gelatins with different viscosities can be used to adjust the rheological properties of the layer. But instead of or together with gelatin, use can be made of one or more other natural and/or synthetic hydrophilic colloids, e.g. albumin, casein, zein, polyvinyl alcohol, alginic acids or salts thereof, cellulose derivatives such as carboxymethyl cellulose, modified gelatin, e.g. phthaloyl gelatin etc. The total amount of binder in the base layer is preferably between 2 and 6 g/m$^2$ and more preferably between 2.5 and 4 g/m$^2$. Preferably the amount of binder in the base layer will be larger than the amount of binder contained in the silver halide emulsion layer. Typically, the amount of binder in the silver halide emulsion layer is preferably between 0.5 g/m$^2$ and 2 g/m$^2$.

The base layer in connection with the present invention preferably also serves as an anti-halation layer, i.e. the base layer preferably contains one or more anti-halation substances. The amount of anti-halation substances is preferably such that the amount of reflected light used for the image-wise exposure of the imaging element is reduced below 10% in order to obtain a sharp image and a high resolution of the printing plate. A particularly preferred anti-halation substance for use in the present invention is carbon black.

According to a particularly preferred embodiment in connection with the present invention the base layer also contains a filler which may partially replace the binder of the base layer. Suitable fillers for use in connection with the present invention are inorganic particles, e.g. silica, titane dioxide, having an average particle diameter of 3 nm to 100 nm. A particularly preferred filler is colloidal silica having an average particle diameter of 4 to 20 nm. It has been found that the addition of a filler to the base layer improves the hydrophilic character of the non-image areas and consequently enhances the difference in ink acceptance between the image and non-image areas. The filler particles can be used in an amount of 0.1 to 1.5 g/m$^2$ and more preferably in an amount of 0.2 to 0.9 g/m$^2$. Mixtures of different type of filler particles may also be used.

As already stated above, the use of a matting agent that does not substantially protrudes from the base layer, the hydrophilic character of the non-image areas is reduced and the printing plate tends to accept ink at the non-image areas. This problem can be reduced or avoided by making use of an image receiving layer having physical development nuclei that have a number average diameter of less than 6 nm and wherein the number of nuclei having a diameter larger than 4.5 nm is not more than 15% of the total number of nuclei in the receiving layer. More preferably the number of nuclei having a diameter larger than 4.5 nm is not more than 10% of the total number of nuclei in the receiving layer. The average diameter of the physical development nuclei can be determined by means of Electron microscopy.

Suitable physical development nuclei for use in connection with the present invention are heavy metal nuclei including noble metal nuclei such as e.g. Ag, Pt, Pd etc.. Most preferably sulphides of heavy metals are used such as e.g. PdS, AgS, AgNiS etc . . .

The photographic silver halide emulsions can be prepared from soluble silver salts and soluble halides according to different methods as described e.g. by P. Glafkides in "Chimie et Physique Photographique", Paul Montel, Paris (1967), by G. F. Duffin in "Photographic Emulsion Chemistry", The Focal Press, London (1966), and by V. L. Zelikman et al in "Making and Coating Photographic Emulsion", The Focal Press, London (1966).

The photographic silver halide emulsions used according to the present invention can be prepared by mixing the halide and silver solutions in partially or fully controlled conditions of temperature, concentrations, sequence of addition, and rates of addition. The silver halide can be precipitated according to the single-jet method or the double-jet method.

The silver halide particles of the photographic emulsions used according to the present invention may have a regular crystalline form such as a cubic or octahedral form or they may have a transition form. They may also have an irregular crystalline form such as a spherical form or a tabular form, or may otherwise have a composite crystal form comprising a mixture of said regular and irregular crystalline forms.

The silver halide emulsion(s) for use in connection with the present invention are preferably silver chlorobromide emulsions that may contain up to 2 mol % of silver iodide. Preferably, the amount of silver bromide is between 15 mol % and 35 mol % and more preferably between 20 mol % and 35 mol %. By using a substantial amount of silver bromide in the silver halide emulsion, the loss of speed of the imaging element when using an anti-halation layer having a reflection of less than 10% can be compensated. However when an amount of silver bromide of more than 35 mol % is used, a decrease of the printing properties of the printing plate is observed. The emulsions preferably belong to the core/shell type well known to those skilled in the art in the sense that substantially all the bromide is concentrated in the core. A particularly preferred silver halide emulsion of the latter type is described in U.S. Pat. No. 5,059,508.

The average size of the silver halide grains may range from 0.10 to 0.70 $\mu m$, preferably from 0.25 to 0.45 $\mu m$.

The size distribution of the silver halide particles of the photographic emulsions to be used according to the present invention can be homodisperse or heterodisperse. A homodisperse size distribution is obtained when 95% of the grains have a size that does not deviate more than 30% from the average grain size.

Preferably during the precipitation stage Iridium and/or Rhodium containing compounds or a mixture of both are added. The concentration of these added compounds ranges from $10^{-8}$ to $10^{-3}$ mole per mole of $AgNO_3$, preferably between $10^{-7}$ and $10^{-6}$ mole per mole of $AgNO_3$. This results in the building in in the silver halide crystal lattice of minor amounts of Iridium and/or Rhodium, so-called Iridium and/or Rhodium dopants. As known to those skilled in the art numerous scientific and patent publications disclose the addition of Iridium or Rhodium containing compounds or compounds containing other elements of Group VIII of the Periodic System during emulsion preparation.

The emulsions can be chemically sensitized e.g. by adding sulphur-containing compounds during the chemical ripening stage e.g. allyl isothiocyanate, allyl thiourea, and sodium thiosulphate. Also reducing agents e.g. the tin compounds described in BE-P 493,464 and 568,687, and polyamines such as diethylene triamine or derivatives of aminomethane-sulphonic acid can be used as chemical sensitizers. Other suitable chemical sensitizers are noble metals and noble metal compounds such as gold, platinum, palladium, iridium, ruthenium and rhodium. This method of chemical sensitization has been described in the article of R. Koslowsky, Z. Wiss. Photogr. Photophys. Photochem. 46, 65–72 (1951).

The emulsions of the DTR element can be spectrally sensitized according to the spectral emission of the exposure source for which the DTR element is designed.

Suitable sensitizing dyes for the visible spectral region include methine dyes such as those described by F. M. Hamer in "The Cyanine Dyes and Related Compounds", 1964, John Wiley & Sons. Dyes that can be used for this purpose include cyanine dyes, merocyanine dyes, complex cyanine dyes, complex merocyanine dyes, homopolar cyanine dyes, hemicyanine dyes, styryl dyes and hemioxonol dyes. Particularly valuable dyes are those belonging to the cyanine dyes, merocyanine dyes, complex merocyanine dyes.

The silver halide emulsions may contain the usual stabilizers e.g. homopolar or salt-like compounds of mercury with aromatic or heterocyclic rings such as mercaptotriazoles, simple mercury salts, sulphonium mercury double salts and other mercury compounds. Other suitable stabilizers are azaindenes, preferably tetra- or penta-azaindenes, especially those substituted with hydroxy or amino groups. Compounds of this kind have been described by BIRR in Z. Wiss. Photogr. Photophys. Photochem. 47, 2–27 (1952). Other suitable stabilizers are i.a. heterocyclic mercapto compounds e.g. phenylmercaptotetrazole, quaternary benzothiazole derivatives, and benzotriazole. Preferred compounds are mercapto substituted pyrimidine derivatives as disclosed in U.S. Pat. No. 3,692,527.

The silver halide emulsions may contain pH controlling ingredients. Preferably the emulsion layer is coated at a pH value below the isoelectric point of the gelatin used in the emulsion layer to improve the stability characteristics of the coated layer. Other ingredients such as antifogging agents, development accelerators, wetting agents, and hardening agents for gelatin may be present.

More details about the composition, preparation and coating of silver halide emulsions can be found in e.g. Product Licensing Index, Vol. 92, December 1971, publication 9232, p. 107–109.

The silver halide emulsion layer and base layer and other optional hydrophilic layers in water-permeable relationship therewith are preferably hardened. Suitable hardening agents, especially when the binder is gelatin are e.g. of the epoxide type, those of the ethylenimine type, those of the vinylsulfone type e.g. 1,3-vinylsulphonyl-2-propanol, chromium salts e.g. chromium acetate and chromium alum, aldehydes e.g. formaldehyde, glyoxal, and glutaraldehyde, N-methylol compounds e.g. dimethylolurea and methyloldimethylhydantoin, dioxan derivatives e.g. 2,3-dihydroxy-dioxan, active vinyl compounds e.g. 1,3,5-triacryloyl-hexahydro-s-triazine, active halogen compounds e.g. 2,4-dichloro-6-hydroxy-s-triazine, and mucohalogenic acids e.g. mucochloric acid and mucophenoxychloric acid. These hardeners can be used alone or in combination. The binders can also be hardened with fast-reacting hardeners such as carbamoylpyridinium salts of the type, described in U.S. Pat. No. 4,063,952.

Supports for the imaging element suitable for use in accordance with the present invention may be opaque or transparent, e.g. a paper support or resin support. When a paper support is used preference is given to one coated at one or both sides with an Alpha-olefin polymer, e.g. a polyethylene layer which optionally contains an anti-halation dye or pigment. It is also possible to use an organic resin support e.g. cellulose nitrate film, cellulose acetate film, poly(vinyl acetal) film, polystyrene film, a polyester film e.g. poly(ethylene terephthalate) film, polycarbonate film, polyvinylchloride film or poly-Alpha-olefin films such as polyethylene or polypropylene film. The thickness of such organic resin film is preferably comprised between 0.07 and 0.35 mm. These organic resin supports are preferably coated with a layer improving the adhesion of the gelatin containing layers.

A particularly suitable adhesion improving layer, comprises a copolymer containing water-soluble monomers and water-insoluble monomers in a molar ratio between 1:99 and 20:80. Preferably the water soluble monomer is a monomer having one or more carboxylic acid groups. An example of an especially preferred copolymer for use in said adhesion improving layer is a polymer containing 1% to 10% by weight, more preferably 1% to 5% by weight of itaconic acid. Suitable polymers containing itaconic acid are e.g. copolymers of itaconic acid and vinylidene chloride, copolymers of itaconic acid, vinylidene chloride and vinylacetate, copolymers of itaconic acid, vinylidene chloride and methyl (meth) acrylate, copolymers of itaconic acid and vinyl chloride, copolymers of itaconic acid, vinyl chloride, vinylidene chloride and methyl(meth)acrylate etc . . . A copolymer of itaconic acid, vinylidene chloride and optionally methyl(meth)acrylate wherein the amount of itaconic acid is between 1% and 5%, the amount of vinylidene chloride is between 70% and 95% and the amount of methyl(meth)acrylate is between 0% and 15%. The adhesion improving layer is preferably free of gelatin.

On top of this adhesion improving layer there may be provided a further intermediate layer containing microparticles having an average diameter of less than 50 nm preferably colloidal silica and gelatin preferably in a weight ratio of 1:2 and 2:1.

According to the method of the present invention for obtaining a printing plate with an imaging element as described above, the imaging element is image-wise exposed to a high intensity short time scanning exposure, e.g. a He/Ne laser or LED-device, and is subsequently developed by means of alkaline processing liquid in the presence of silver halide solvent(s) and developing agent(s).

The alkaline processing liquid used for developing the imaging element in accordance with the method of the present invention preferably contains at least part of the silver halide solvent(s). Preferably the silver halide solvent is used in an amount between 0.01% by weight and 10% by weight and more preferably between 0.05% by weight and 8% by weight. Suitable silver halide solvents for use in connection with the present invention are e.g. 2-mercaptobenzoic acid, cyclic imides, oxazolidones, thiocyanates and thiosulfates. Further suitable silver halide solvents for use in connection with the present invention are described in EP-A-554584.

According to the present invention the alkaline processing liquid preferably also contains hydrophobizing agents for improving the hydrophobicity of the silver image obtained in the image receiving surface layer. The hydrophobizing agents used in connection with the present invention are compounds that are capable of reacting with silver or silver ions and that are hydrophobic i.e. insoluble in water or only slightly soluble in water. Generally these compounds contain a mercapto group or thiolate group and one or more hydrophobic substituents e.g. an alkyl group containing at least 3 carbon atoms. Examples of hydrophobizing agents for use in accordance with the present invention are e.g. those described in U.S. Pat. Nos. 3,776,728, 4,563,410 and EP-A-554584.

The alkaline processing liquid may also contain the developing agent(s) used in accordance with the present invention. In this case the alkaline processing liquid is called a developer. On the other hand some or all of the developing agent(s) may be present in one or more layers of the imaging element. When all of the developing agents are contained in the imaging element the alkaline processing liquid is called an activator or activating liquid.

Silver halide developing agents for use in accordance with the present invention are preferably of the p-dihydroxybenzene type, e.g. hydroquinone, methylhydroquinone or chlorohydroquinone, preferably in combination with an auxiliary developing agent being a 1-phenyl-3-pyrazolidinone-type developing agent and/or p-monomethylaminophenol. Particularly useful auxiliary developing agents are of the phenidone type e.g. 1-phenyl-3-pyrazolidinone, 1-phenyl-4-monomethyl-3-pyrazolidinone, and 1-phenyl-4,4-dimethyl-3-pyrazolidinone. However other developing agents can be used.

The alkaline processing liquid preferably also contains a preserving agent having antioxidation activity, e.g. sulphite ions provided e.g. by sodium or potassium sulphite. For example, the aqueous alkaline solution comprises sodium sulphite in an amount ranging from 0.15 to 1.0 mol/l. Further may be present a thickening agent, e.g. hydroxyethylcellulose and carboxymethylcellulose, fog inhibiting agents, e.g. potassium bromide, potassium iodide and a benzotriazole which is known to improve the printing endurance, calcium-sequestering compounds, anti-sludge agents, and hardeners including latent hardeners.

Development acceleration can be accomplished with the aid of various compounds to the alkaline processing liquid and/or one or more layers of the photographic element, preferably polyalkylene derivatives having a molecular weight of at least 400 such as those described in e.g. U.S. Pat. Nos. 3,038,805; 4,038,075; 4,292,400; 4,975,354.

Subsequent to the development in an alkaline processing liquid the surface of the printing plate is preferably neutralized using a neutralization liquid.

A neutralization liquid generally has a pH between 5 and 7. The neutralization liquid preferably contains a buffer e.g. a phosphate buffer, a citrate buffer or mixture thereof. The neutralization solution can further contain bactericides, e.g. phenol, thymol or 5-bromo-5-nitro-1,3-dioxan as described in EP 0,150,517. The liquid can also contain substances which influence the hydrophobic / hydrophilic balance of the printing plate obtained after processing of the DTR element, e.g. silica. Further the neutralization solution can contain wetting agents, preferably compounds containing perfluorinated alkyl groups.

The invention will now be illustrated by the following examples without however the intention to limit the invention thereto. All parts are by weight unless otherwise specified.

EXAMPLE 1

Preparation of a Silver Halide Emulsion

A gelatino silver halide emulsion was prepared by double jet precipitation by slowly mixing with stirring an aqueous solution of $AgNO_3$ having a concentration of 2 mole/l, and an aqueous solution having a concentration of 1.7 mole/l of NaCl, 0.48 mole/l of KBr and 0.001 mole/l of KI. Before the precipitation $5.10^{-4}$ mole/l of sodium hexachlororhodaat was added to the silver nitrate solution. In a second part of the precipitation an aqueous solution of $AgNO_3$ having a concentration of 1 mole/l was slowly mixed with an aqueous solution of NaCl at a concentration of 1.3 mole/l.

The temperature during the silver halide formation was 55° C.

The obtained core-shell emulsion was cooled, flocculated and washed. Gelatin was added in an amount sufficient to reach a ratio of ⅔ by weight of gelatin to silver halide, expressed as equivalent amount of silver nitrate. Subsequently a chemical ripening was carried out in a conventional way known to those skilled in the art using thiosulphate and gold salts. Finally the emulsion was sensitized for the red spectral region (600–700 nm).

Preparation of the physical development nuclei:

A coating solution (1) containing PdS nuclei was prepared as follows.

| Solution A (20° C.): $(NH_4)_2PdCl_4$ | 1.74 g |
|---|---|
| polyvinyl alcohol (1% solution in water) | 20 ml |
| water | 380 ml |
| Solution B (20° C.): $Na_2S.9H_2O$ | 1.61 g |
| polyvinyl alcohol (1% solution in water) | 20 ml |
| water | 380 ml |
| Solution C (20°C.): polyvinyl alcohol (1% solution in water) | 40 ml |
| water | 760 ml |

Solution A and B were simultaneously added to solution C at a rate of 100 ml/min. whilst stirring solution C at 400 rpm. To remove the excess sulphide the obtained mixture was dialysed using a hollow fiber dialyser having a surface of 1.5 $m^2$ and a molecular cut-off of 8000. The solution containing the PdS-nuclei was pumped through the dialyser with a delivery of 400 ml/min. and water flows around the fibers with a delivery of 400 ml/min. The solution was brought to a conductivity of 0.5 mS and the pH was kept between 7.2 and 7.8.

The size of the obtained nuclei and their distribution was measured using Transmission Electron Microscopy. It was found that about 23% of the nuclei have a diameter larger than 4.5 nm while the average diameter is 3.9 nm.

A coating solution (2) containing PdS-nuclei was prepared similar to the above procedure with the exception that 3.23 g of $Na_2S.9H_2O$ was added to solution C. It was found that about only 2% of the nuclei have a diameter more than 4.5 nm while the average diameter is 1.8 nm.

Preparation of the Imaging Elements

A polyethylene terephthalate film support provided with a adhesion improving layer was coated with an intermediate layer containing gelatin in an amount of 0.4 g/$m^2$ and colloidal silica having an average particle diameter of 7 nm in an amount of 0.4 g/$m^2$. The adhesion improving layer contained a copolymer of itaconic acid (2%), vinylidene chloride (88%) and methylmethacrylate (10%) at a total coverage of about 0.2 g/$m^2$.

Photographic DTR mono-sheet materials were prepared as follows. One side of the above described polyethylenenterephthalate film support was coated with two layers by a double layer coating technique the layer nearer to the support being the antihalation layer and the other being the emulsion layer. The emulsion was coated at an amount of silver halide corresponding to 1.5 g AgNO$_3$/$m^2$. This emulsion layer contained 0.1 g/$m^2$ of 1-phenyl-3-pyrazolidinone and 1.0 g/$m^2$ of gelatin.

The antihalation layer contained carbon black and gelatin at 3 g/$m^2$. The total thickness of the antihalation layer together with the adhesion improving layer and intermediate layer was about 3.8 μm.

After drying these layers were subjected to a temperature of 40° C. for 5 days and then overcoated with a layer containing PdS nuclei using either coating solution (1) or (2) described above. The layer further contained hydroquinone at 0.4 g/$m^2$ and formaldehyde at 100 mg/$m^2$.

Different imaging elements were prepared according to the above procedure by varying the location and amount of matting agent and by selecting either coating solution (1) or (2) for the physical development nuclei layer. The details of these imaging elements are set out in Table 1.

TABLE 1

| | amount (g/$m^2$)/size (μm) of matting agent in | | coating solution |
|---|---|---|---|
| Sample no. | AH | EM | for the nuclei |
| 1 | 0 | 0.2/5 | 1 |
| 2 | 0.8/5 | 0 | 1 |
| 3 | 0.8/2 | 0 | 1 |
| 4 | 0.8/2 | 0 | 2 |
| 5 | 0.8/5 | 0 | 2 |

AH = antihalation layer
EM = silver halide emulsion layer

The following processing solutions were prepared:

| Activator solution | |
|---|---|
| sodium hydroxide (g) | 30 |
| sodium sulphite anh. (g) | 33 |
| potassium thiocyanate (g) | 20 |
| 3-mercapto-4-acetamido-5-n.heptyl-1,2,4-triazole (g) | 0.15 |
| water to make | 1000 ml |
| Neutralization solution | |
| citric acid | 10 g |
| sodium citrate | 35 g |
| cysteine | 1 g |
| sodium sulphite anh. | 5 g |
| phenol | 50 mg |
| water to make | 1000 ml |
| Dampening solution | |
| water | 880 ml |
| citric acid | 6 g |
| boric acid | 8.4 g |
| sodium sulphate anh. | 25 g |
| ethyleneglycol | 100 g |
| colloidal silica | 28 g |

Each of the DTR materials as described above were image-wise exposed in the HeNe laser containing image-setter were subsequently treated with the above described activator solutions for 15 seconds at 30° C., thereupon treated with the described neutralization solution at 25° C. and finally dried.

Each of the obtained printing plates thus prepared were mounted on an offset printing machine (AB Dick 9860 CD—trade name for offset printing machine manufactured by AB DICK Co). During the printing run the described dampening solution was used in each case.

The printing plates were evaluated for the number of prints that could be obtained and the occurance of staining. These evaluations were quantified as follows:

| Printing endurance: | |
|---|---|
| 1 | <5000 |
| 2 | 5000–8000 |
| 3 | 8000–10000 |
| 4 | >10000 |
| Occurance of staining: | |
| 1 | heavy staining |
| 2 | moderate staining |

-continued

| | 3 | little or no staining |
|---|---|---|

The obtained result for each of the printing plates was as follows:

| Sample no. | Printing endurance | Staining |
|---|---|---|
| 1 | 1 | 3 |
| 2 | 2 | 2 |
| 3 | 4 | 1 |
| 4 | 4 | 3 |
| 5 | 2 | 3 |

I claim:

1. An imaging element comprising on a support in the order given a base layer containing a matting agent having a number average diameter between 0.4 and 1 times the thickness of said base layer, a spectrally sensitized silver halide emulsion layer and a receiving layer containing physical development nuclei having an average diameter less than 6 nm and wherein the number of nuclei having a diameter larger than 4.5 nm is less than 15% of the total number of nuclei contained in said receiving layer and wherein substantially no matting agent is present in said receiving layer, silver halide emulsion layer or any other layer optionally being present between said receiving layer and silver halide emulsion layer.

2. An imaging element according to claim 1 wherein said base layer further comprises an anti-halation substance in amount such that the amount of reflection at the wavelengths for which the silver halide emulsion layer is spectrally sensitized is below 10%.

3. An imaging element according to claim 1 wherein said silver halide emulsion is a silver chlorobromide emulsion containing between 15 mol % and 35 mol % of silver bromide and optionally up to 2 mol % of silver iodide.

4. An imaging element according to claim 1 wherein said base layer further comprises a filler.

5. A method for making a lithographic printing plate comprising the steps of image-wise exposing by means of a high intensity short time scanning exposure an imaging element comprising on a support in the order given a base layer containing a matting agent having a number average diameter between 0.4 and 1 times the thickness of said base layer, a spectrally sensitized silver halide emulsion layer and a receiving layer containing physical development nuclei having an average diameter less than 6 nm and wherein the number of nuclei having a diameter larger than 4.5 nm is less than 15% of the total number of nuclei contained in said receiving layer and wherein substantially no matting agent is present in said receiving layer, silver halide emulsion layer or any other layer optionally being present between said receiving layer and silver halide emulsion layer and subsequently developing a thus obtained imaging element by an alkaline processing liquid in the presence of developing agent(s) and silver halide solvent(s).

* * * * *